US006797586B2

United States Patent
Dev

(10) Patent No.: US 6,797,586 B2
(45) Date of Patent: Sep. 28, 2004

(54) SILICON CARBIDE SCHOTTKY BARRIER DIODE AND METHOD OF MAKING

(75) Inventor: Alok Dev, Danbury, CT (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/894,084

(22) Filed: Jun. 28, 2001

(65) Prior Publication Data

US 2003/0001156 A1 Jan. 2, 2003

(51) Int. Cl.[7] .................................................. H01L 21/76
(52) U.S. Cl. ...................... 438/423; 438/237; 438/572; 438/518
(58) Field of Search ................................. 438/518, 237, 438/423, 572, 431, FOR 336, FOR 415, 670

(56) References Cited

U.S. PATENT DOCUMENTS

| 3,412,456 | A | * | 11/1968 | Ebisawa ..................... 438/670 |
| 3,445,926 | A | * | 5/1969 | Medved et al. ............. 438/533 |
| 3,567,508 | A | * | 3/1971 | Cox et al. ................... 438/660 |
| 4,115,120 | A | * | 9/1978 | Dyer et al. ................. 438/670 |
| 4,448,800 | A | * | 5/1984 | Ehara et al. ............... 438/639 |
| 4,481,041 | A | * | 11/1984 | Muller ....................... 438/523 |
| 4,558,508 | A | * | 12/1985 | Kinney et al. .............. 438/401 |
| 4,599,243 | A | * | 7/1986 | Sachdev et al. ............ 216/18 |
| 4,679,303 | A | * | 7/1987 | Chen et al. ................. 438/289 |
| 4,687,541 | A | * | 8/1987 | Penney ....................... 438/670 |
| 4,692,205 | A | * | 9/1987 | Sachdev et al. ............ 438/670 |
| 4,745,045 | A | * | 5/1988 | Fredericks et al. ........ 430/315 |
| 4,929,567 | A | * | 5/1990 | Park et al. .................. 438/182 |
| 5,006,488 | A | * | 4/1991 | Previti-Kelly .............. 438/670 |
| 5,087,322 | A | * | 2/1992 | Lillienfeld et al. ......... 427/282 |
| 5,270,244 | A | * | 12/1993 | Baliga ............... 148/DIG. 148 |
| 5,610,098 | A | * | 3/1997 | Huang et al. .............. 257/472 |
| 5,612,232 | A | * | 3/1997 | Thero et al. ............... 438/523 |
| 5,635,412 | A | * | 6/1997 | Baliga et al. ........ 257/E29.104 |

OTHER PUBLICATIONS

IBM Technical Disclosure Bulletin NN81102453, Oct. 1981 pp. 2543–2544.*
Disclosure ID700627—PHA23, B68, U.S. Ser. No. 09/455,633, Filed Dec. 7, 1999.

* cited by examiner

*Primary Examiner*—George Fourson
(74) *Attorney, Agent, or Firm*—Aaron Waxler

(57) ABSTRACT

A Schottky barrier diode and process of making is disclosed. The process forms a metal contact pattern in masked areas on a silicon carbide wafer. A preferred embodiment includes on insulating layer that is etched in the windows of the mask. An inert edge termination is implanted into the wafer beneath the oxide layer and adjacent the metal contacts to improve reliability. A further oxide layer may be added to improve surface resistance to physical damage.

8 Claims, 5 Drawing Sheets

SILICON CARBIDE SCHOTTKY BARRIER DIODE AND METHOD OF MAKING

RELATED APPLICATION

This invention relates to U.S. patent application Ser. No. 09/455,663, filed Dec. 7, 1999, which is incorporated herein by reference.

FIELD OF THE INVENTION

The present invention relates to the field of semiconductors, and more particularly to a Schottky barrier diode formed on a silicon carbide substrate.

BACKGROUND OF THE INVENTION

It has been known that silicon carbide (SiC) is a superior substrate material for the fabrication of devices such as Schottky barrier rectifiers and MOSFETs. The properties of SiC are generally considered ideal for high voltage applications as they result in low on-resistance and low reverse recovery time, on the order of <2 ns. Prior work by the present inventor, as described in the '627 application, has disclosed that edge termination and surface passivation improve the ruggedness of the semiconductor device. The method of fabrication disclosed in the '627 application and other previous methods require the use of multiple photolithography and precise mask alignment to produce a reliable device. The invention disclosed in the '627 patent application involves three steps of photolithography and two steps of alignment, resulting in an improved product, but requiring an expensive process. In addition, the alignment steps must be implemented on state-of-the-art equipment that is often not available in older fabrication facilities. The present invention provides a less complex fabrication process that can be completed on less sophisticated equipment with equal or better performance characteristics.

Therefore, it is an object of the present invention to provide a Schottky barrier diode and a method for fabrication with a minimum of process steps.

It is an additional object of the present invention to provide a method for the fabrication of a Schottky barrier diode without the need for multiple photolithography steps or mask alignment.

These and other objects will become more apparent from the description of the invention to follow.

SUMMARY OF THE INVENTION

The present invention provides an improved and more efficient method for the fabrication of SiC Schottky diodes. The fabrication method involves applying a mask to a surface of a SiC wafer. Typically, the wafer surface is passivated with an oxide layer, which must be etched away in the open areas of the mask prior to metal deposition. A metal layer or stack of metal layers is deposited on the wafer surface and the mask is removed, lifting the metal with the mask while leaving metal contacts in the oxide etched open area of the wafer. Edge termination using ion implantation of inert ions is created on the wafer surface adjacent the metal contacts to improve diode performance. Optionally, a second oxide layer can be deposited and etched down to below the level of the metal contacts.

DETAILED DESCRIPTION OF THE INVENTION

Figure 1:
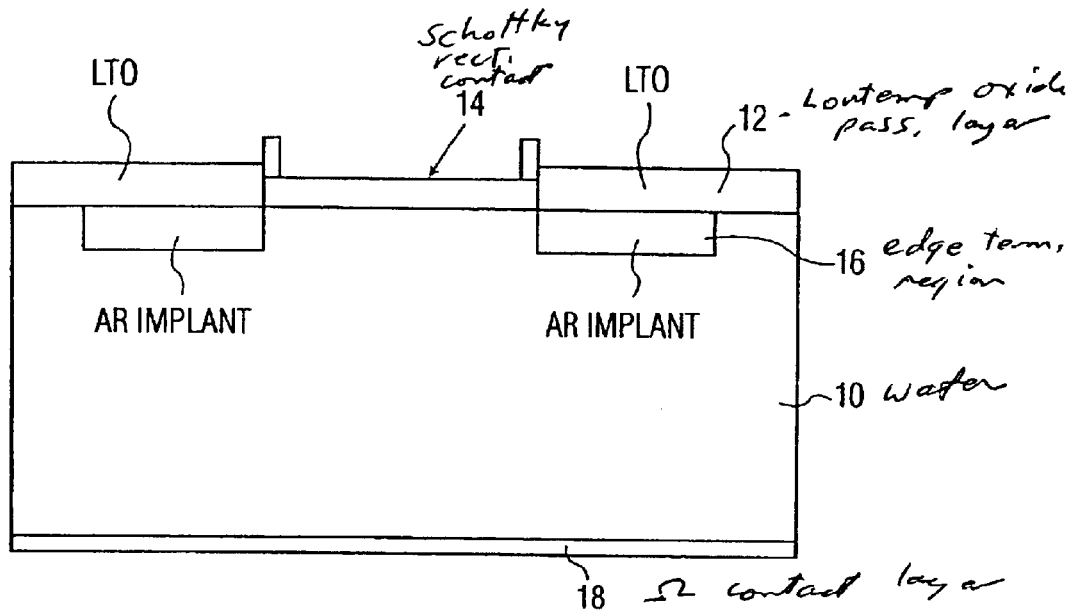
FIG. 1 is a diagrammatic depiction of a Schottky barrier diode formed according to the prior related patent application.

A Schottky barrier diode is illustrated in FIG. 1 that is formed according to the process of prior filed patent application Ser. No. 09/700,627, incorporated herein by reference. Ohmic contact layer 18, for example having metal contacts, and preferably formed of titanium, and Schottky rectifying contact 14 are deposited on and bonded to a SiC wafer 10. An ion implanted edge termination region 16 is created in SiC wafer 10 adjacent the edges of Schottky contact 14, preferably using an inert gas ion, for example argon. A low temperature oxide passivated layer 12 is then deposited on wafer 10 adjacent Schottky contact 14. While it is believed that the Schottky barrier diode so fabricated has the requisite properties to function as required, the manufacturing process involves three lithographic masking steps to form contact 14, oxide layer 12, and edge termination 16 requiring the use of state-of-the-art equipment. The second and third mask applications require two alignment steps, and this method is thus time consuming and expensive.

The process according to the present invention is illustrated sequentially in FIGS. 2A–2H. Although no Ohmic secondary contact is shown, it will be obvious to those skilled in the art that such a contact is provided on the opposite surface of wafer 10. This process provides a concise electrical contact area on the surface of the semiconductor wafer for electrical power transmission control functions as will be described in detail. The process of the invention also provides surface passivation and edge termination for the devices. The basic operation of applying a masking material to a surface to define chemical activity is well known in the art. However, creation of a surface passivated and edge terminated Schottky barrier diode with only one masking step is a significant improvement over prior methods.

Figure 2A:
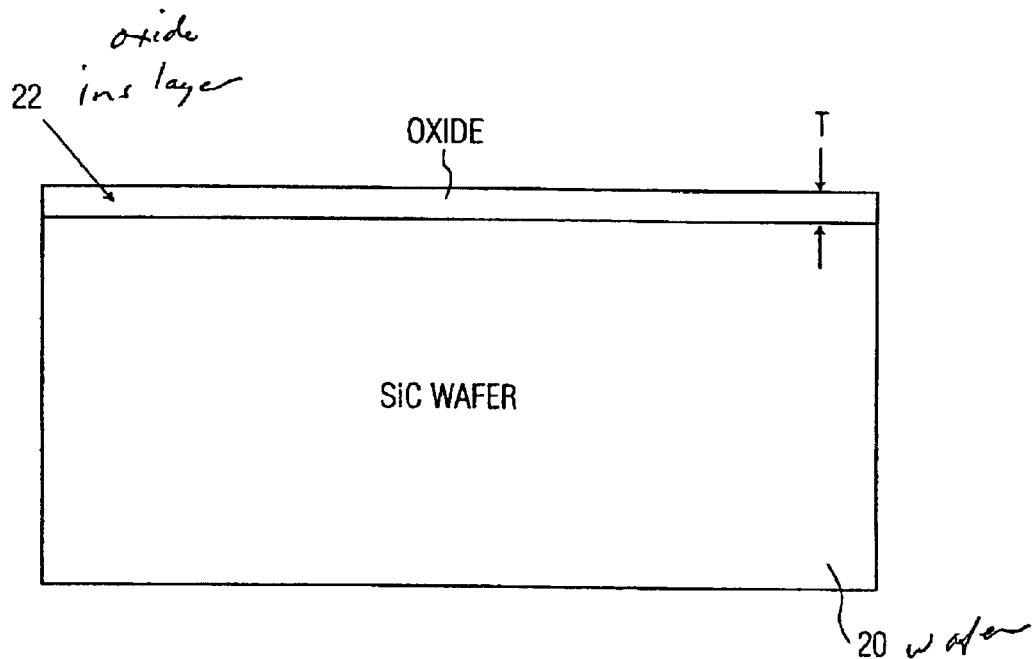
FIGS. 2A–2H are a series of diagrammatic depictions of a SiC wafer in sequential steps as it is formed into a Schottky barrier diode according to the present invention.

FIG. 2A shows SiC wafer 20 with an insulating layer, for example a low temperature oxide layer 22, formed on its upper surface. Oxide layer 22 is typically of a silicon dioxide deposited at a temperature of not more than 450° C., and in the range of 410° C. in the preferred embodiment. According to the present invention, layer 22 is comparatively thin, having a thickness T of about 500 Angstroms. Oxide layer 22 may alternately be grown on SiC wafer 20 by a variety of thermal oxidation techniques that are well known in the art. Oxide layer 22 is provided as a surface passivant insulator that will be etched in a selected pattern. As a further variation of the present invention, SiC wafer 20 may be formed into a Schottky barrier diode without the formation of any insulating surface layer, in which case the etching step described in relation to FIG. 2C is not performed.

Figure 2B:
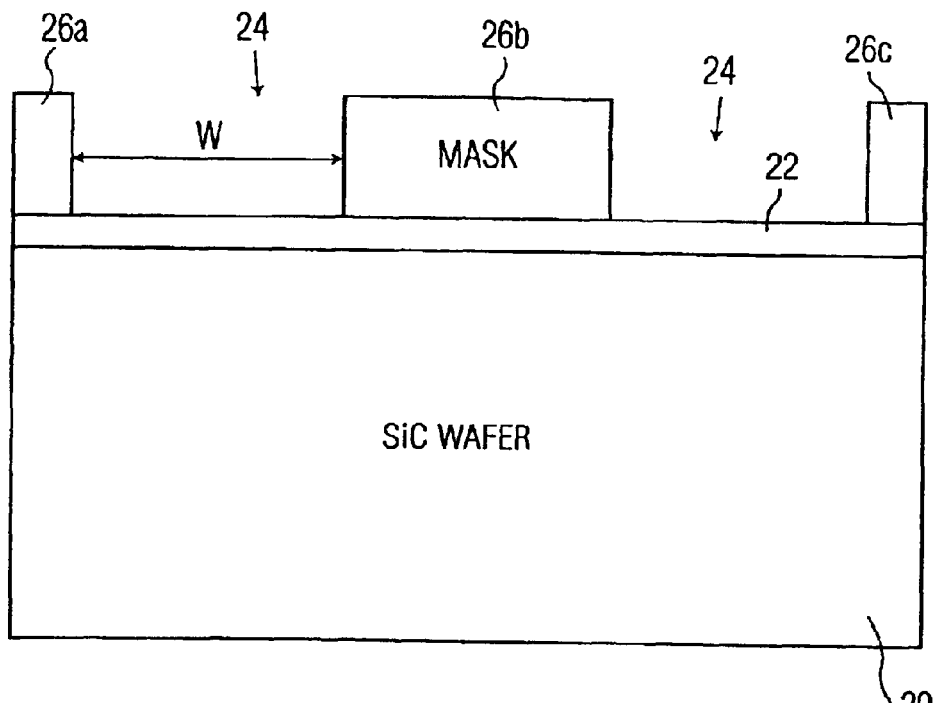

Each of the sequential drawings 2B–2H illustrates the next step in the invention process after the prior step. Referring now to FIG. 2B, mask 26 is positioned on oxide layer 22. Mask 26 is noted as mask parts 26a, 26b, and 26c in the drawing to show that windows 24 define openings to permit deposition of a desired material in selected portions of the substrate surface. Typical window 24 has a width W of greater than approximately 100 μm. The mask could be formed by such techniques as patterned adhesive tape, photolithography, or metal masking, with photolithography preferred.

Figure 2C:
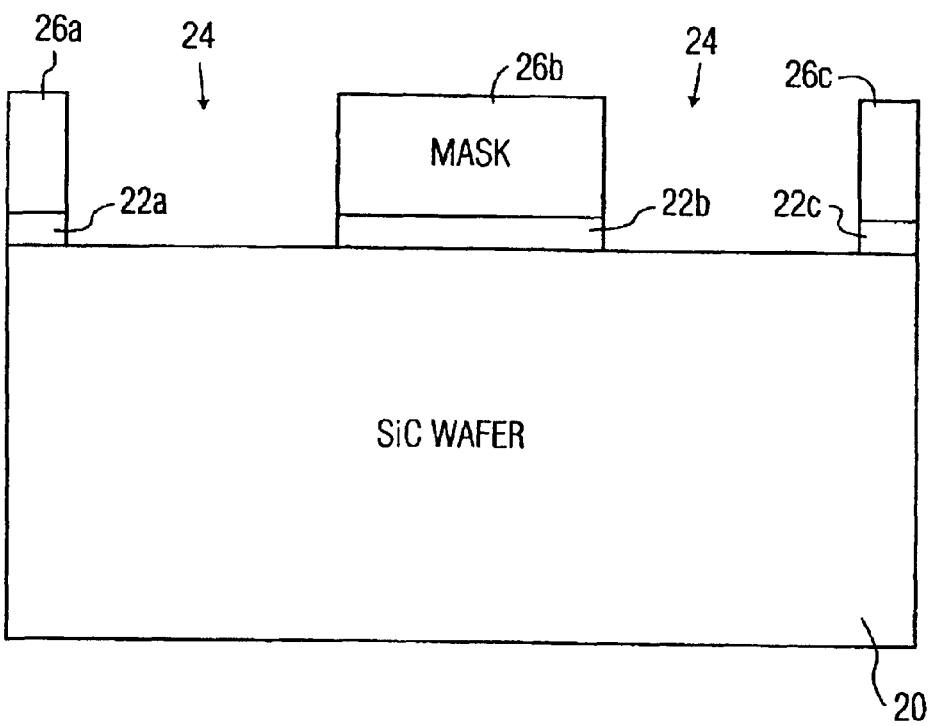

Referring now to FIG. 2C, oxide layer 22 is etched in the area of mask windows 24 to remove oxide and expose selected portions of the surface of SiC wafer 20. Mask 26 remains in place through this and subsequent steps. Oxide layer 22 is now denoted as separated portions 22a, 22b, and 22c. Depending on the nature of the metal that is to be deposited, the etched surface of SiC wafer 20 may now be subjected to additional treatment, for example cleaning by use of a solvent, acid, or caustic compound or surface etching or ion implantation. However, if a SiC wafer 20 with no oxide layer is used, this step is skipped.

Figure 2D:
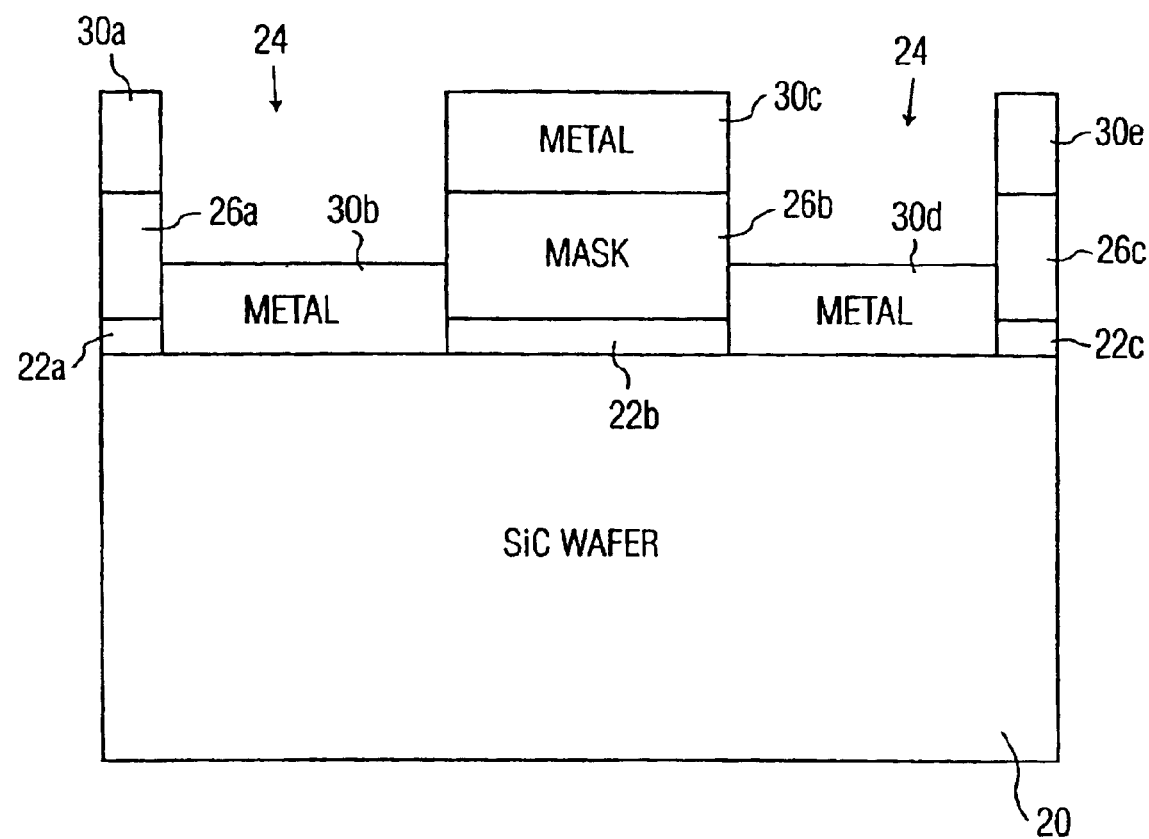

FIG. 2D shows SiC wafer 20 after metal has been deposited, typically by evaporation means in one or multiple layers, to form metal deposit 30. The multiple layers, referred to as stacks, of metal deposition may be of the same metal or different metals, for example titanium, nickel, and silver. However, since metal deposit 30 is less thick than mask 26, metal deposit 26 will result in discontinuous portions, designated as 30a–30e. Only metal deposit portions 30b and 30d, residing within mask windows 24, contact the surface of SiC wafer 20.

Figure 2E:
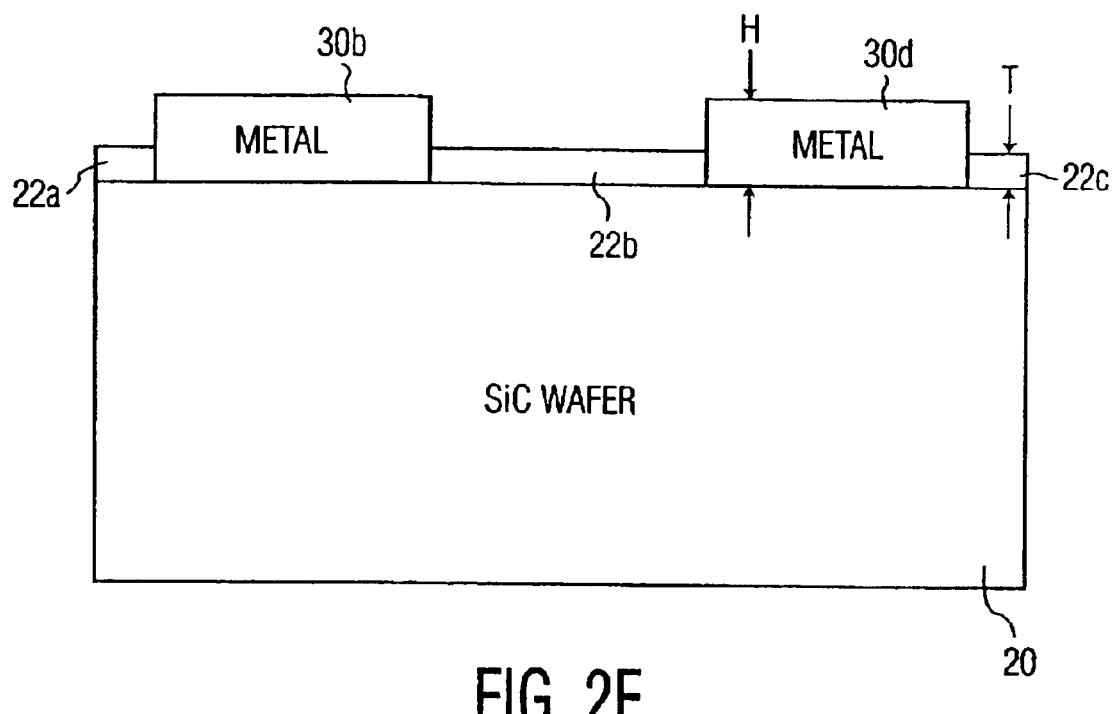

Subsequently, in the process step shown in FIG. 2E, mask 26 has been removed together with metal deposit portions 30a, 30c, and 30e (see FIG. 2D). The residual metal deposit portions 30b and 30d are of greater height H than the thickness T of oxide layer 22. At this stage, having performed the steps of applying one mask 26 to an oxide layer 22, etching the oxide layer 22, forming a metal deposit 30, and removing mask 26 together with the overlaying metal, a functional Schottky barrier diode has been completed. By use of a single mask, the need for alignment of subsequent masks that pertained to prior methods is avoided. In addition, the mere step of providing, applying, and removing multiple masks has been eliminated.

Figure 2F:
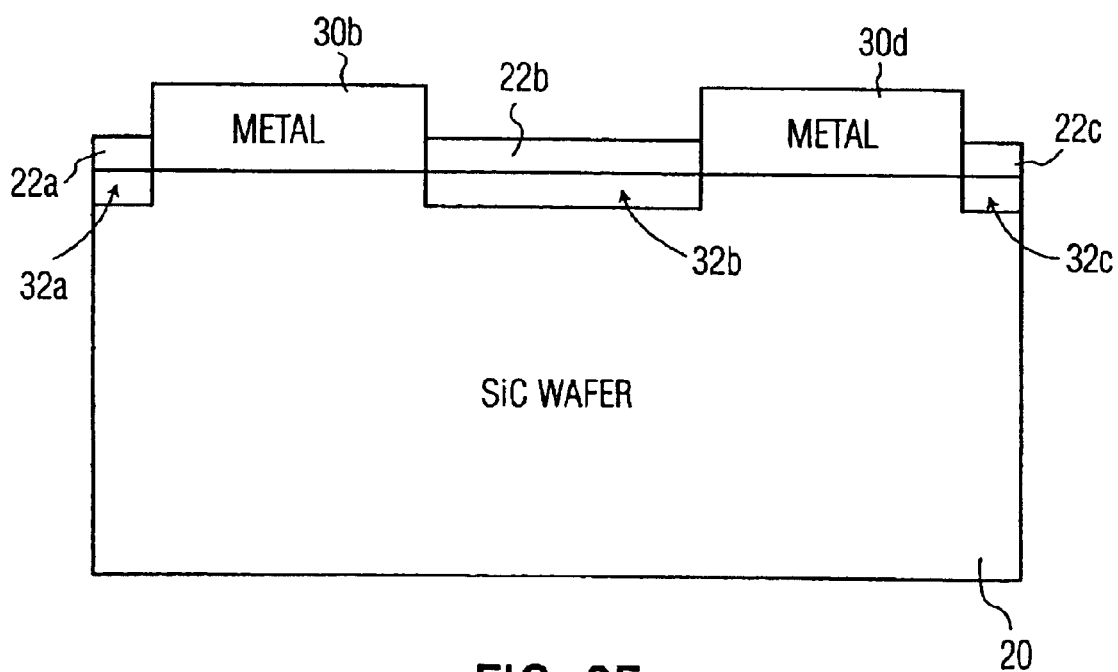

In order to further improve the performance characteristics of the Schottky diode, an additional step, illustrated in FIG. 2F, is to create an edge termination layer 32, for example by ion implantation of an inert ion, preferably argon ions. Edge termination layer 32 is formed to extend the depletion layer in lateral direction adjacent each of metal deposits 30b and 30d, thus effectively reducing the electric field crowding. Ion implantation is preferably accomplished at high dose, i.e. greater than $1 \times 10^{15}$ per $cm^2$ and low energy, i.e. close to 20 keV. Implantation is preferably accomplished either substantially perpendicular to the surface of SiC wafer 20, or at a small angle off the vertical, to achieve a sharp border with metal portions 30b and 30d. It is noted that minimal lateral diffusion of the ion will preserve a sharp border at such small angle of ion implantation. Edge termination 32 is denoted in this phase as segments 32a, 32b, and 32c, which exist where there is no metal, also referred to as self-aligned ion implantation.

Figure 2G:
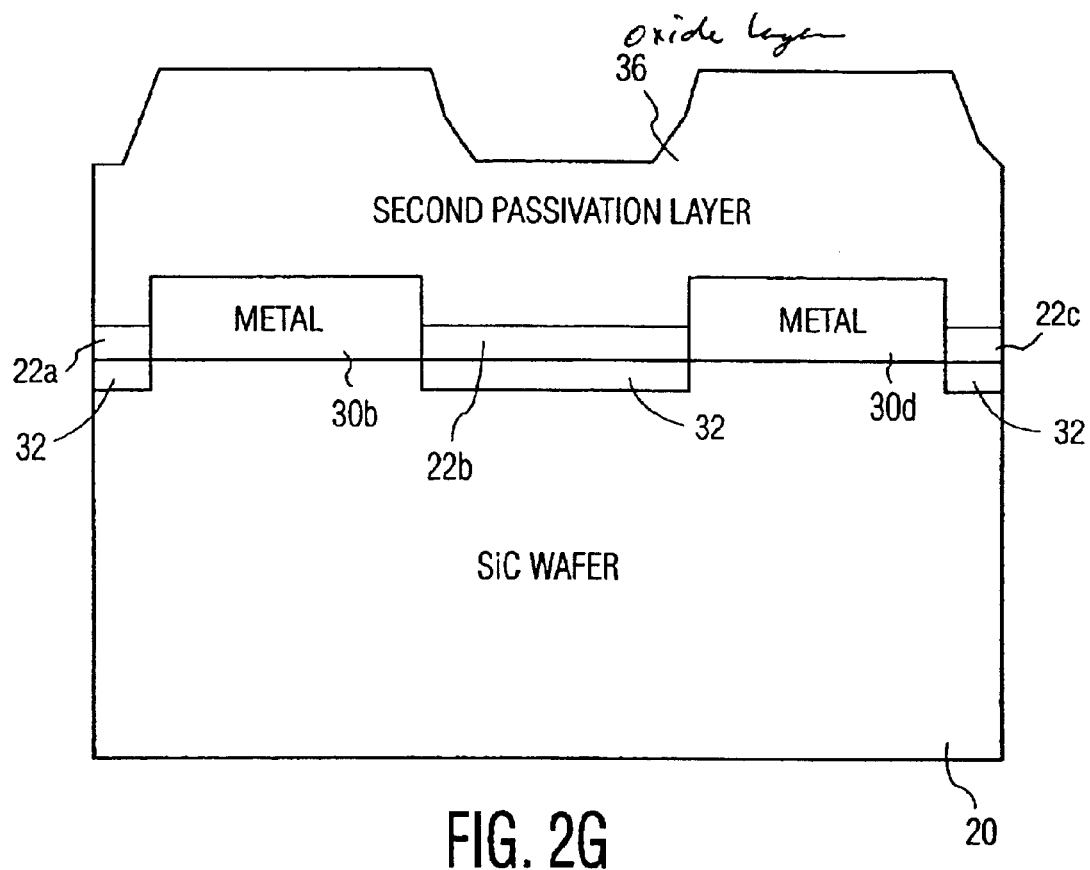
Figure 2H:
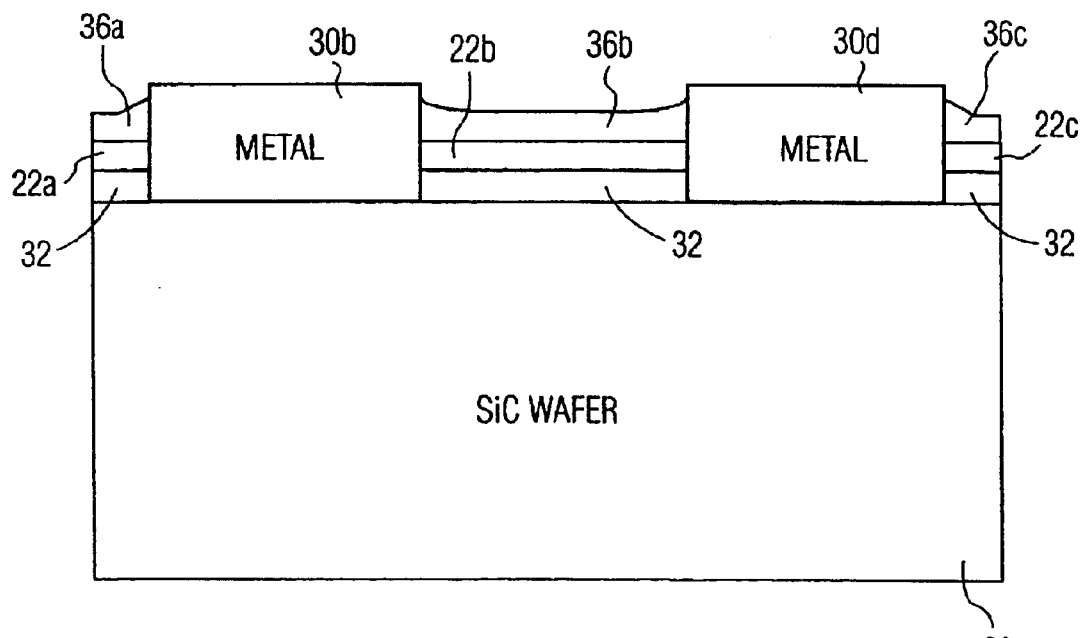

In certain environments and under certain operating conditions, it is desired to provide semiconductor devices, such as a Schottky barrier diode, with improved protection against scratching or other types of surface damage. A second passivation can be performed, resulting in a further oxide layer 36 to cover metal deposits 30 and first oxide layer 22 as seen in FIG. 2G. A final process step, shown in FIG. 2H, is to etch or otherwise remove the surface of oxide layer 36 so as to expose the surface of metal deposits 30b and 30d. Intermediate portions of oxide layer 36, when chemical etching is employed, will be etched somewhat below the surface of metal deposits 30b and 30d, as is illustrated. In this form, contact reliability with metal portions 30b and 30d is optimized. The barrier diodes are now complete through a fabrication process involving a single mask. The fabrication process is completed by separation from the SiC wafer and packaging.

While the present invention is described with respect to specific embodiments thereof, it is recognized that various modifications and variations thereof may be made without departing from the scope and spirit of the invention, which is more clearly understood by reference to the claims appended hereto.

What is claimed is:

1. A method for the fabrication of a Schottky barrier diode on an SiC wafer, comprising the steps of:
   (a) forming an insulating layer on the surface of the SiC wafer;
   (b) placing a mask having a window on an exposed surface of the insulating layer;
   (c) etching away a portion of the insulating layer corresponding to the window to expose a portion of the SiC wafer therebeneath;
   (d) while retaining the mask in place, depositing conductive material on the mask and exposed portions of the wafer surface;
   (e) stripping off the mask so as to leave the conductive material deposited upon the portion of the wafer surface corresponding to the window; and
   (f) implanting an edge termination layer into the wafer beneath the surface of the insulating layer but not beneath the conductive material.

2. The method for the fabrication of a Schottky barrier diode as described in claim 1, wherein the step of forming an insulating layer comprises forming an oxide layer.

3. The method for the fabrication of a Schottky barrier diode as described in claim 2, wherein the step of implanting an edge termination layer comprises implanting inert ions.

4. The method for the fabrication of a Schottky barrier diode as described in claim 3, wherein the inert ions comprise argon ions.

5. The method for the fabrication of a Schottky barrier diode as described in claim 1, further comprising the step of applying a treatment to the exposed portion of the SiC wafer surface, the treatment selected from a group consisting of chemical cleaning, surface etching and ion implantation.

6. The method for the fabrication of a Schottky barrier diode as described in claim 1, further comprising the step of depositing a passivation layer over the conductive material and the wafer and removing portions of the passivation layer that cover the conductive material.

7. The method for the fabrication of a Schottky barrier diode as described in claim 1 wherein the conductive material is a metal.

8. A method for the fabrication of a Schottky barrier diode on an SiC wafer, comprising the steps of:
   (a) forming an insulating layer on a surface of the SiC wafer;
   (b) placing a mask having a window on an exposed surface of the insulating layer;
   (c) etching away a portion of the insulating layer corresponding to the window to expose the SIC wafer therebeneath;
   (d) while retaining the mask in place, depositing conductive material on the mask exposed portions of the wafer surface;
   (e) stripping off the mask so as to leave the conductive material deposited upon the portion of the wafer surface corresponding to the window;
   (f) applying a treatment to the exposed portion of the SiC wafer surface, the treatment selected from a group consisting of chemical cleaning, surface etching and ion implantation; and
   (g) implanting an edge termination layer into the wafer beneath the surface of the insulating layer but not beneath the conductive material.

\* \* \* \* \*